US007226512B2

(12) United States Patent
Fury et al.

(10) Patent No.: US 7,226,512 B2
(45) Date of Patent: Jun. 5, 2007

(54) LOAD LOCK SYSTEM FOR SUPERCRITICAL FLUID CLEANING

(75) Inventors: Michael A. Fury, San Francisco, CA (US); Robert W. Sherrill, San Rafael, CA (US)

(73) Assignee: EKC Technology, Inc., Haywood, CA (US)

( * ) Notice: Subject to any disclaimer, the term of this patent is extended or adjusted under 35 U.S.C. 154(b) by 535 days.

(21) Appl. No.: 10/465,906

(22) Filed: Jun. 18, 2003

(65) Prior Publication Data
US 2004/0255979 A1    Dec. 23, 2004

(51) Int. Cl.
*B08B 5/04* (2006.01)

(52) U.S. Cl. .................. 134/21; 414/217; 414/331.01; 414/938; 414/939; 414/941; 134/23; 134/25.1; 134/25.4; 134/26; 134/32; 134/42; 134/902

(58) Field of Classification Search ................. 414/938, 414/939, 941, 47, 271, 331.01, 217; 134/21, 134/23, 25.1, 25.4, 26, 32, 42, 902
See application file for complete search history.

(56) References Cited
U.S. PATENT DOCUMENTS

| | | | |
|---|---|---|---|
| 4,693,777 A * | 9/1987 | Hazano et al. ......... | 156/345.31 |
| 6,224,312 B1 * | 5/2001 | Sundar ........................ | 414/217 |
| 6,254,328 B1 * | 7/2001 | Wytman ...................... | 414/217 |
| 6,335,284 B1 * | 1/2002 | Choi et al. ................... | 438/689 |
| 6,460,369 B2 * | 10/2002 | Hosokawa ................... | 62/378 |
| 6,672,864 B2 * | 1/2004 | Wang et al. .................. | 432/5 |
| 6,748,960 B1 * | 6/2004 | Biberger et al. .............. | 134/61 |
| 6,763,840 B2 * | 7/2004 | DeSimone et al. ......... | 134/109 |
| 6,896,513 B2 * | 5/2005 | Bachrach et al. ........... | 432/121 |
| 2002/0061248 A1 * | 5/2002 | Tepman ................... | 414/744.5 |
| 2003/0213143 A1 * | 11/2003 | Shih et al. ..................... | 34/72 |

* cited by examiner

*Primary Examiner*—Sharidan Carrillo
(74) *Attorney, Agent, or Firm*—Morgan Lewis & Bockius LLP

(57) ABSTRACT

A substrate is transferred from an environment at about vacuum into a load lock through a first door. The substrate is then sealed within the load lock. The pressure within the load lock is raised to a high pressure above vacuum. A second door coupling the load lock to a high-pressure processing chamber is then opened and the substrate moved from the load lock into the high-pressure chamber. The substrate is then sealed within the high-pressure chamber. High-pressure processing, such as high pressure cleaning or high pressure deposition, is then performed on the substrate within the high-pressure chamber. Subsequently, the second door is opened and the substrate transferred into the load lock. The substrate is then sealed within the load lock. The pressure within the load lock is lowered to about vacuum and the first door opened. The substrate is then removed from the load lock into the environment.

14 Claims, 5 Drawing Sheets

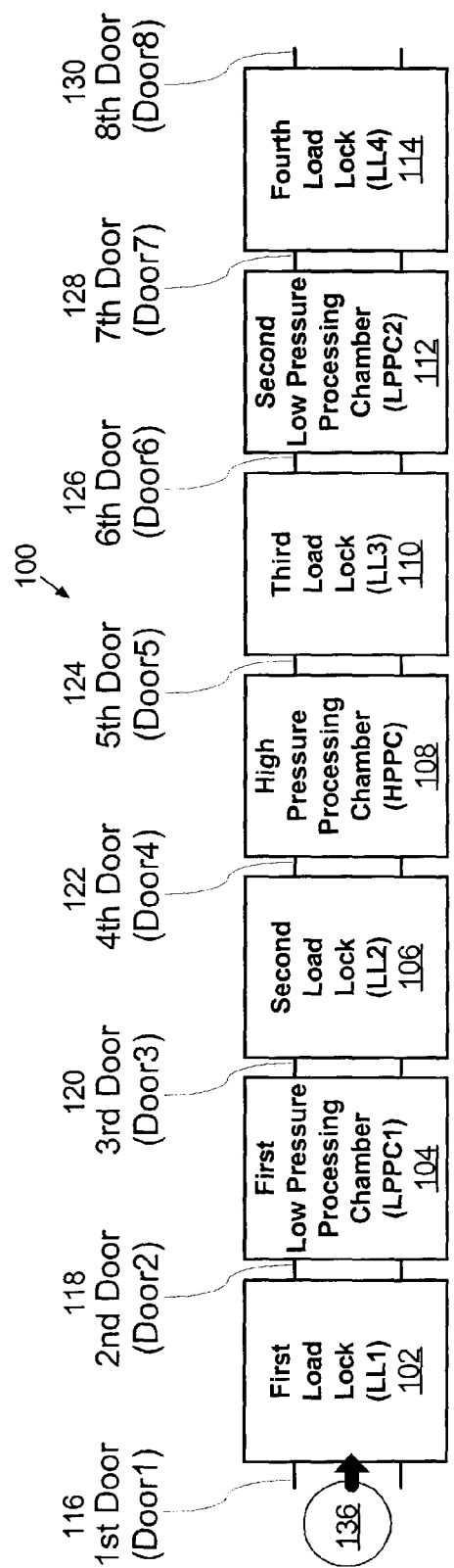
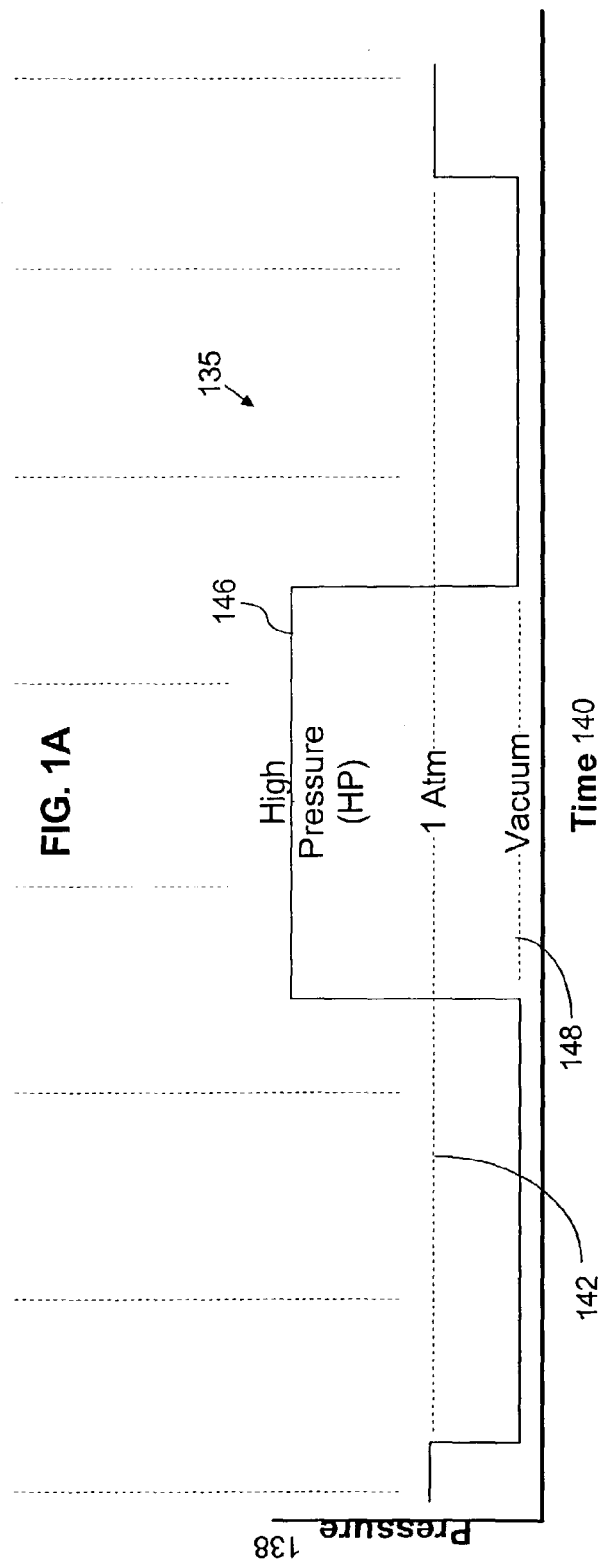
FIG. 1A
FIG. 1B

LOAD LOCK SYSTEM FOR SUPERCRITICAL FLUID CLEANING

BACKGROUND OF THE INVENTION

1. Field of the Invention

The invention relates generally to semiconductor processing systems. In particular, the present invention relates to a load lock system for coupling a high-pressure processing module to existing semiconductor processing tools that operate at or near vacuum.

2. Description of Related Art

Semiconductor fabrication typically processes substrates, such as circular wafers, into semiconductor chips by sequentially exposing each substrate to a number of individual processes, such as photo masking, etching, implantation, and cleaning. Modern semiconductor processing systems often include cluster tools that aggregate multiple processing chambers around a central transfer chamber housing a substrate handling robot. The multiple processing chambers may include, for example, degas chambers, substrate preconditioning chambers, cool down chambers, transfer chambers, chemical vapor deposition (CVD) chambers, physical vapor deposition chambers, etch chambers, or the like.

The various processing chambers and the transfer chamber can be isolated from one another to limit potential contamination of the semiconductors and to ensure that optimal processing conditions are maintained. Examples of cluster tools can be found in U.S. Pat. Nos. 5,955,858, 5,447,409, 5,469,035, and 6,071,055, all of which are incorporated herein by reference.

Conventional processing performed in these processing chambers, such as Low Pressure Chemical Vapor Deposition (LPCVD), typically occurs at or near vacuum. Accordingly, a load lock is typically provided to introduce a substrate at atmospheric pressure into the cluster tool kept at vacuum Semiconductor fabrication also typically requires cleaning resist and/or etching residue from the surface of the substrate. Generally, there are two methods for cleaning the surface of a substrate, namely, wet and dry processing. Wet processing consists of a series of steps of spraying and/or immersing the substrate in expensive chemical solutions that are typically not environmentally friendly. Instead, dry processing consists of a series of steps that use gasses instead of wet chemical solutions to clean the substrate. For example, ashing using an O2 plasma.

More recently, supercritical fluids, such as carbon dioxide ($CO_2$) with or without co-solvents or surfactants, are now being used to clean or strip photoresists or post-etch residue from semiconductor substrates. Supercritical cleaning is, therefore, a cleaning process that is neither wet nor dry.

Cleaning with supercritical fluids is desirable, as such fluids retain the properties of a liquid, but have the diffusivity and viscosity of a gas. The solvency of supercritical fluids can be enhanced by the addition of chemical agents or co-solvents that interact with materials used in semiconductor manufacturing. The supercritical fluid, with or without a co-solvent, typically acts as a solvent to remove contaminants from the wafer surface and effectively clean the surface of the substrate.

Supercritical fluid cleaning technology can be applied in many industrial processes to significantly reduce or eliminate the use of hazardous chemicals, to conserve natural resources such as water, and to accomplish tasks previously not possible, such as rapid precision cleaning of small features (e.g., resist images, VLSI (Very Large Scale Integration) topographical features such as vias, etc.) of semiconductor devices.

Moreover, cycling pressure between high and low limits near the supercritical pressure and temperature may be practiced to achieve particular process performance. This is otherwise known as phase shifting.

Accordingly, supercritical fluid processing may be safer, less expensive, and more performance effective as compared to conventional wet or dry processing. However, unlike conventional processing, supercritical technologies require high-pressure working environments to maintain the supercritical fluid phase. Also, the effectiveness as a solvent of supercritical fluids is increased with increasing pressure.

Because of the large differences in working pressures, supercritical fluid cleaning is typically kept separate from conventional semiconductor processing. Therefore, when supercritical fluid processes are required, a substrate being processed in a cluster tool must first be removed from the cluster tool before being positioned in the supercritical fluid cleaning module. Thereafter, the substrate may need to be removed from the supercritical fluid cleaning module and repositioned in the cluster tool for further processing. This drastically decreases the overall throughput afforded by current automated cluster tool technology and increases the likelihood of contamination due to such transfers.

Coupling supercritical fluid cleaning modules to existing cluster tools has numerous challenges, including the large differences in pressures between the conventional processes and the supercritical fluid processes, the cycle time needed to pressurize and de-pressurize the process chamber, and contamination of the transfer chamber by particulates removed in the supercritical fluid cleaning module. Accordingly, a method and system for coupling a supercritical fluid cleaning module to existing automated processing tools would be highly desirable.

BRIEF SUMMARY OF THE INVENTION

According to one embodiment, there is provided a method for processing a substrate. A substrate is transferred from an environment at about vacuum into a load lock through a first door. The substrate is then sealed within the load lock. The pressure within the load lock is raised to a high pressure above vacuum. A second door coupling the load lock to a high-pressure processing chamber is then opened and the substrate moved from the load lock into the high-pressure chamber. The substrate is then sealed within the high-pressure chamber. High-pressure processing, such as high pressure cleaning or high pressure deposition, is then performed on the substrate within the high-pressure chamber. Subsequently, the second door is opened and the substrate transferred into the load lock. The substrate is then sealed within the load lock. The pressure within the load lock is lowered to about vacuum and the first door opened. The substrate is then removed from the load lock into the environment.

In a preferred embodiment, the performing further comprises processing the substrate with liquid $CO_2$ or supercritical $CO_2$, where the high pressure within the chamber is between about 60 psi to about 3000 psi at a temperature of about 35 degrees C. In a more preferred embodiment, the performing further comprises high pressure cleaning of the substrate with a supercritical fluid, where the high pressure within the chamber is between about 100 psi to about 2000 psi at a temperature of about 35 degrees C. In a most preferred embodiment, the performing further comprises high pressure cleaning the substrate with liquid $CO_2$, where the high pressure within the chamber is between about 100 psi to about 500 at a temperature of about 35 degrees C., and for a supercritical $CO_2$ the high pressure within the chamber is between about 1070 psi to about 1800 psi at a temperature of about 35 degrees C.

According to another embodiment, there is provided a substrate processing system. This system includes a load lock and a high-pressure processing chamber. The load lock has a first door configured for coupling to a vacuum environment. The high-pressure processing chamber is coupled to the load lock via a second door. The load lock is configured to operate between vacuum and a high pressure, while the high-pressure processing chamber is configured to operate at the high pressure. The system also preferably includes a transfer chamber coupled to the load lock at the first door. The transfer chamber operates at an internal pressure of about vacuum. A transfer robot is preferably positioned within the transfer chamber. In a preferred embodiment, the high-pressure processing chamber is configured for high pressure cleaning the substrate with liquid or supercritical $CO_2$, where the high pressure within the chamber is between about 60 psi to about 3000 psi at a temperature of about 35 degrees C. In a more preferred embodiment, the performing further comprises high pressure cleaning of the substrate with a supercritical fluid, where the high pressure within the chamber is between about 100 psi to about 2000 psi at a temperature of about 35 degrees C. In a most preferred embodiment, the performing further comprises high pressure cleaning the substrate with liquid $CO_2$, where the high pressure within the chamber is between about 100 psi to about 500 at a temperature of about 35 degrees C., and for a supercritical $CO_2$ the high pressure within the chamber is between about 1070 psi to about 1800 psi at a temperature of about 35 degrees C.

Accordingly, the invention addresses: the large differences in pressures between the conventional processes and the supercritical fluid processes; contamination of the transfer chamber by particulates removed in the supercritical fluid cleaning module; the long periods of time required to adjust the pressure in the high volume transfer chamber; and pressure cycling effects within the transfer chamber

BRIEF DESCRIPTION OF THE DRAWINGS

For a better understanding of the nature and objects of the invention, reference should be made to the following detailed description, taken in conjunction with the accompanying drawings, in which:

FIG. 1A is a diagrammatic top view of a substrate processing system incorporating a load lock, according to an embodiment of the system;

FIG. 1B is a simplified graph of pressure versus time as the substrate passes through the system shown in FIG. 1A;

Like reference numerals refer to corresponding parts throughout the several views of the drawings.

DETAILED DESCRIPTION OF THE INVENTION

Figure 1C:
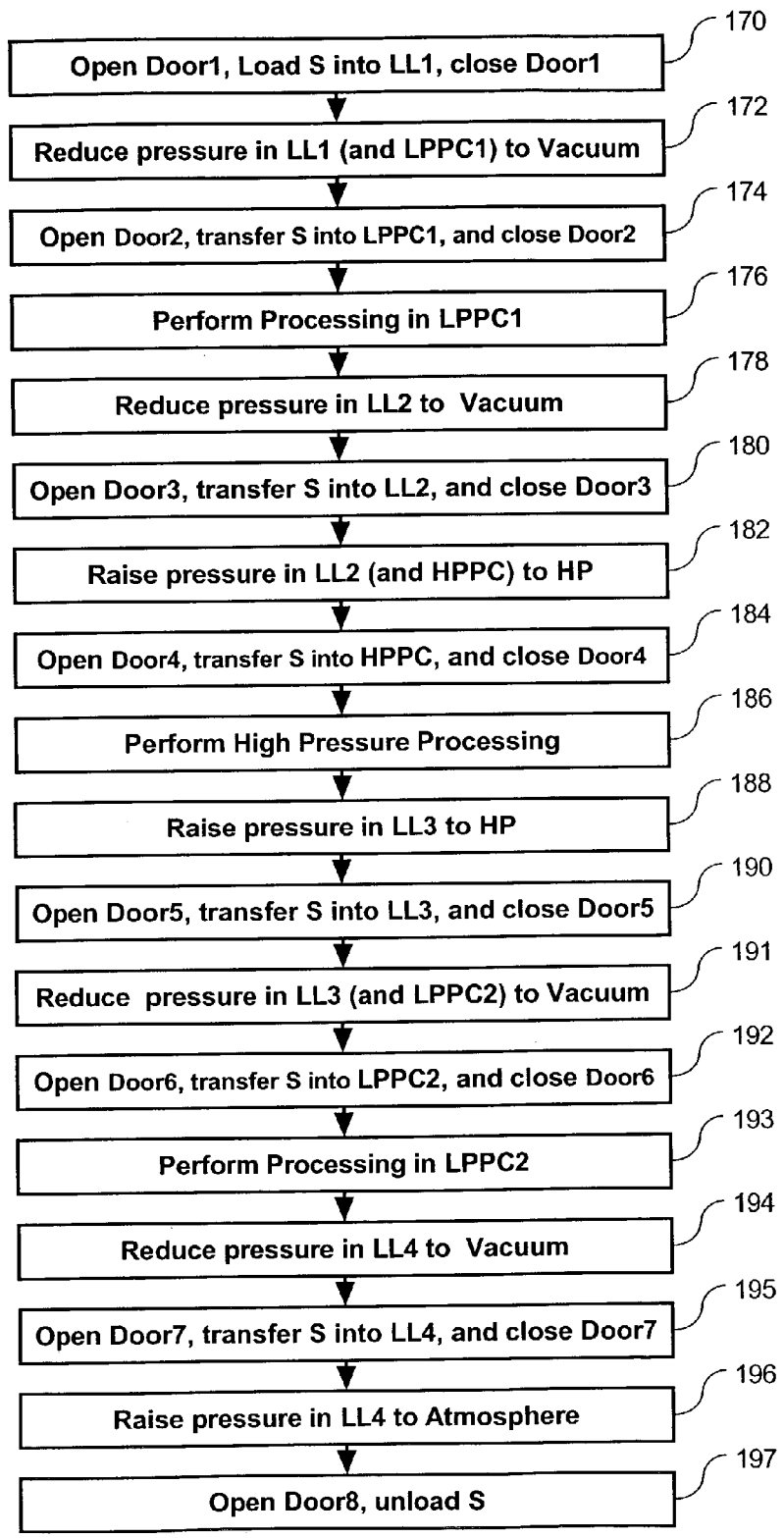
FIG. 1C is a flow chart of the method for processing a substrate, according to the embodiment of the invention described above in relation to FIGS. 1A and 1B.

The systems and methods described below are used for high pressure processing of a substrate. Such high pressure processing includes any processing that occurs at pressures substantially higher than vacuum, such as at pressures between 60 psi to 3000 psi. In addition, such high pressure processing specifically includes high pressure cleaning, or high pressure thin film deposition. High pressure cleaning is typically used to remove photoresist or post-etch residue from the surface of a substrate, while high pressure thin film deposition is used to deposit desired materials or precursors to desired materials on the substrate.

FIG. 1A is a diagrammatic top view of a substrate processing system 100 incorporating a load lock, according to an embodiment of the system. The system 100 is used for in-line processing a substrate (S) 136 using conventional processing tools, at or near vacuum. The system 100 is also used for in-line high-pressure processing of the substrate (S) 136 before, during, or after the conventional processing. The substrate (S) 136 is preferably a semiconductor wafer, but may be any other component that requires processing at low pressures, such as at vacuum.

The system 100 preferably includes at least one low-pressure processing chamber operating at or near vacuum, a high-pressure processing chamber that operates at or near supercritical fluid pressures and temperatures, and at least a load lock separating the two. However, in a more likely embodiment, the system 100 preferably includes multiple low pressure processing chambers 104 and 112, at least one high-pressure processing chamber (HPPC) 108, and multiple load locks 102, 106, 110, and 114.

More specifically, the system 100 includes a first load lock (LL1) 102 having a first door (Door1) 116 through which the substrate (S) 136 is introduced into the system from the system's surrounding environment, which is generally at or near atmospheric pressure. The first load lock (LL1) 102 also includes a second door (Door2) 118 coupling the first load lock (LL1) 102 to a first low-pressure processing chamber (LPPC1) 104. A third door (Door3) 120 couples the first low-pressure processing chamber (LPPC1) 104 to a second load lock (LL2) 106. Similarly, a fourth door (Door4) 122 couples the second load lock (LL2) 106 to a high-pressure processing chamber (HPPC) 108; a fifth door (Door5) 124 couples the high-pressure processing chamber (HPPC) 108 to a third load lock (LL3) 110; a sixth door (Door6) 126 couples the third load lock (LL3) 110 to a second low-pressure processing chamber (LPPC2) 112; a seventh door (Door7) 128 couples the second low-pressure processing chamber (LPPC2) 112 to a fourth load lock (LL4) 114; and an eighth door (Door8) 130 couples the fourth load lock (LL4) 114 to the surrounding environment at or near atmospheric pressure. It should, however, be appreciated that the system could include more or less processing chambers, where each set of processing chambers is separated by a load lock. Similarly, it should be appreciated that the system could include more or less high-pressure processing chambers, where each set of high-pressure processing chambers is separated from a processing chamber by a load lock. In an alternative embodiment, two high-pressure processing chambers may be coupled to one another within the system without a load lock separating the two. For example, the process sequence could require going from supercritical $CO_2$ cleaning into supercritical $CO_2$ deposition in separate chambers.

Conventional processing is performed in the first and second low-pressure processing chambers 104 and 112 at or near vacuum. Such processing may include, Chemical Vapor Deposition (CVD), Low Pressure Chemical Vapor Deposition (LPCVD), Rapid Thermal Processing (RTP), etching, ashing, or the like. Accordingly, the first and second low-pressure processing chambers 104 and 112 are configured for operation at pressures at or near vacuum and for temperatures associated with the particular process being performed.

High pressure processing of the substrate (S) 136 is performed in the high-pressure processing chamber (HPPC) 108. Such high pressure processing may include cleaning the substrate at high pressures with dense phase fluids. Dense phase fluids include any of the known gases which may be converted to supercritical fluids or liquified at temperatures and pressures which will not degrade the physical or chemical properties of the substrate being cleaned. These gases typically include, but are not limited to: (1) hydrocarbons, such as methane, ethane, propane, butane, pentane, hexane, ethylene, and propylene; (2) halogenated hydrocarbons such as tetrafluoromethane, chlorodifluoromethane, sulfur hexafluoride, and perfluoropropane; (3) inorganics such as carbon dioxide, ammonia, helium, krypton, argon, sulfur trioxide and nitrous oxide; and (4) mixtures thereof. The term "dense phase fluid" as used herein is intended to include mixtures of such dense phase gases.

In addition, the dense phase fluid selected to remove a particular contaminant is chosen to have a solubility chemistry which is similar to that of the targeted contaminant. For example, if hydrogen bonding makes a significant contribution to the internal cohesive energy content, or stability, of a contaminant, the chosen dense phase fluid must possess at least moderate hydrogen bonding ability in order for solvation to occur. In some cases, a mixture of two or more dense phase cases may be formulated in order to have the desired solvent properties. The selected dense phase fluid must also be compatible with the substrate being cleaned, and preferably has a low cost and high health and safety ratings. Furthermore, the dense phase fluid may include one or more co-solvents to assist in the removal of undesired contaminants from the substrate.

Carbon dioxide is a preferred dense phase fluid for use in practicing the present invention since it is inexpensive and non toxic. The critical temperature of carbon dioxide is about 305 degree Kelvin (32 degrees C.), and the critical pressure is about 72.9 atmospheres (1057 psi). At pressures above the critical point, the phase of the carbon dioxide can be shifted between the liquid phase and supercritical fluid phase by varying the temperature above or below the critical temperature of 305 Kelvin (K). Carbon dioxide is useful for cleaning when a liquid at pressures of between about 4.14 atmospheres (60 psi) to about 34.47 atmospheres (500 psi) at least about 305 degree Kelvin (32 degrees C.). Likewise, carbon dioxide is used for cleaning when a gas at a pressures of between about 72 atmospheres (1044 psi) to about 206 atmospheres (3000 psi) at least about 305 degree Kelvin (32 degrees C.).

Accordingly, in a preferred embodiment the high-pressure processing chamber is preferably configured to operate at internal pressures of between about 4.14 atmospheres (60 psi) to about 206 atmospheres (3000 psi). In a more preferred embodiment, the high-pressure processing chamber is preferably configured to operate at internal pressures of between about 6.9 atmospheres (100 psi) and about 138 atmospheres (2000 psi). In the most preferred embodiment, the high-pressure processing chamber is preferably configured to operate at internal pressures of between about 4.14 atmospheres (60 psi) to about 34.47 atmospheres (500 psi) at about 305 degree Kelvin (32 degrees C.) for liquids, and between about 73.77 atmospheres (1070 psi) to about 124.1 atmospheres (1800 psi) at least about 305 degree Kelvin (32 degrees C.) for gases.

To operate at these high pressures, the high-pressure processing chamber (HPPC) 108 is designed to have characteristics well know to those skilled in the art. For example, the high-pressure processing chamber (HPPC) 108 may have an annular or spherical interior to spread-out the internal pressure; it may have thicker walls than the first and second low-pressure processing chambers; or the like.

In addition, the doors 116 to 130 are configured to hermetically seal, and are preferably opened and closed quickly by hydraulic or pneumatic rams. A transfer mechanism (not shown) is used to transport the substrate (S) 136 through the various load locks, processing chambers, and the high-pressure processing chamber. Such a transfer mechanism may include a conveyer system, a robotic handling system, or the like, as are well known by those skilled in the art. In one preferred embodiment, the transfer mechanism is a substrate handling robot positioned within each of the load locks.

Although not shown, each load lock is coupled to a pressure pump for quickly raising or lowering the pressure within each load lock. Each processing chamber is coupled to the machinery, electronics, and chemistry required to perform its dedicated conventional processing. The high-pressure processing chamber (HPPC) 108 is coupled to machinery, electronics, and chemistry required to perform the necessary processing, such as cleaning using the dense phase fluids described above. The first load lock (LL1) 102 and the fourth load lock (LL4) 114 are configured to raise and lower their internal pressures between atmospheric pressure and vacuum. The second load lock (LL2) 106 and third load lock (LL3) 110 are configured to raise and lower their pressures between vacuum and the high pressure required for processing, as defined above. In addition, those skilled in the art will appreciate that other components are inherent in the above described system. For example, there are: (1) materials of construction compatible with the dense fluids, co-solvents, reaction by-products, and contaminants at the operating pressures and temperatures of the chamber; (2) entry and exit ports for the dense fluids and co-solvents, where these ports are configured to maintain stable and controlled operating pressures; (3) control mechanisms for controlling pressure excursions when valves and doors are open and shut; (4) temperature control mechanisms suitable for maintaining stable and controlled operating temperatures, and for controlling temperature excursions when valves and doors are opened and closed and substrate thermal mass is transferred in or out of the chamber; etc.

FIG. 1B is a simplified graph of pressure 138 versus time 140 as the substrate (S) 136 (FIG. 1A) passes through the system shown in FIG. 1A. FIG. 1C is a flow chart of the method for processing a substrate, according to the embodiment of the invention described above in relation to FIGS. 1A and 1B. The following description will refer primarily to FIG. 1C, but will also make reference to FIGS. 1A and 1B. Once the first door (Door1) 116 is opened, a substrate (S) 136 (FIG. 1A) is loaded into the first load lock (LL1) 102, and the first door closed, at step 170. It should be appreciated that closing any of the doors hermetically seals the door. As can be seen from FIG. 1B the pressure in the first load lock (LL1) 102 is internally at ambient pressure. The pressure in the first load lock (LL1) 102 is then reduced to vacuum (148—FIG. 1B), at step 172. The pressure in the first low-pressure processing chamber (LPPC1) 104 is either already at vacuum or is also reduced to vacuum. The second door (Door2) 118 is then opened; the substrate transferred from the first load lock chamber into the first low-pressure processing chamber (LPPC1) 104; and the second door (Door2) 118 closed, at step 174. Conventional processing is then performed in the first processing chamber (LPPC1) 104, at step 176. While the substrate is being processed, the pressure in the second load lock (LL2) 106 is reduced to vacuum, at step 178. The third door (Door3) 120 is then opened; the substrate transferred into the second load lock (LL2) 106; and the third door closed, at step 180.

The pressure in the second load lock (LL2) 106 is then raised to the high pressure (HP) (146—FIG. 1B), at step 182. The high pressure (HP) is the same as the high pressure described above, i.e., 60 psi to 3000 psi. The pressure in the high-pressure processing chamber (HPPC) 108 is either already at the high pressure (HP) or is also raised to the high pressure (HP). The fourth door (Door4) 122 is then opened; the substrate transferred into the high-pressure processing chamber (HPPC) 108; and the fourth door closed, at step 184. High pressure processing, such as high pressure cleaning, is then performed, at step 186, as is well understood by those skilled in the art. An example of a suitable high pressure cleaning method is disclosed in U.S. Pat. No. 5,013,366, which is hereby incorporated by reference. Such high pressure cleaning may occur after each plasma etch, plasma ash, ion implant, and chemical mechanical polishing (CMP) step; and before each diffusion, ion implant, oxidation, deposition, plasma etch, and rapid thermal anneal/process step. Similarly, high pressure deposition opportunities from a dense fluid medium exist prior to each damascene interconnect copper metal deposition to deposit thin films for diffusion barrier and copper seed layers, or to deposit precursors for those barrier and seed layers, which will subsequently be converted to the barrier or seed layers. Such a sequence for precursor deposition might be LL=>HPPC precursor deposition=>LL=>UV and/or RTP chamber at atmospheric pressure or vacuum to convert the precursor=>copper deposition.

While the high pressure processing is being performed, at step 186, the pressure in the third load lock (LL3) 110 is raised to the high pressure (HP), at step 188. The fifth door (Door5) 124 is then opened; the substrate transferred into the third load lock (LL3) 110; and the fifth door closed, at step 190. The pressure in the third load lock (LL3) 110 is then reduced to vacuum (148—FIG. 1B), at step 191. The pressure in the second low-pressure processing chamber (LPPC2) 112 is either already at vacuum or is also lowered to vacuum. The sixth door (Door6) 126 is then opened; the substrate transferred into the second low-pressure processing chamber (LPPC2) 112; and the sixth door (Door6) 126 closed, at step 192.

Conventional processing is then performed in the second processing chamber (LPPC2) 112, at step 193. While the substrate is being processed, the pressure in the fourth load lock (LL4) 114 is reduced to vacuum, at step 194. The seventh door (Door7) 128 is then opened; the substrate transferred into the fourth load lock (LL4) 114; and the seventh door closed, at step 195. The pressure in the fourth load lock (LL4) 114 is then raised to atmospheric or ambient pressure (142—FIG. 1B), at step 196. The eighth door (Door8) 130 is then opened and the substrate unloaded from the system 100, at step 197. It should be appreciated that after each processing step, all liquids or gases within the chamber may be purged to avoid potential cross contamination.

Figure 2A:
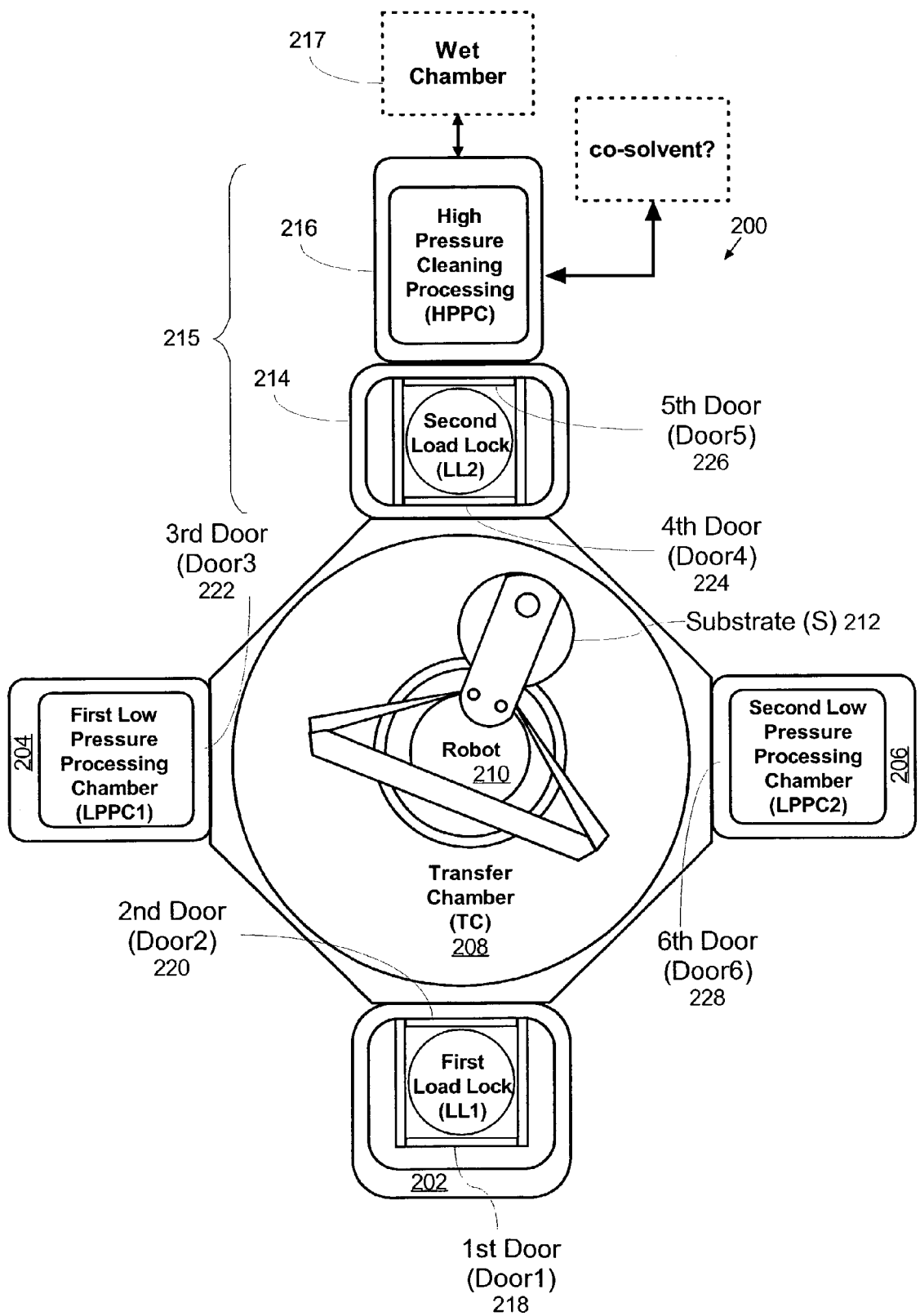
FIG. 2A is a diagrammatic top view of another substrate processing system incorporating a load lock, according to another embodiment of the system.

FIG. 2A is a diagrammatic top view of another substrate processing system 200 incorporating a load lock, according to another embodiment of the system. The system 200 is used for processing a substrate (S) 212, and for high pressure processing of the substrate before, during, or after conventional processing that occurs at or near vacuum. The substrate (S) 212 is preferably a semiconductor wafer, but may be any other component that requires processing at vacuum.

This system 200 is preferably arranged in a cluster tool configuration. The system 200 preferably includes at least one low-pressure processing chamber operating at or near vacuum and at least one high-pressure processing chamber that operates at a high pressure, where the low-pressure and high-pressure processing chambers are separated by at least one load lock.

The system 200 preferably includes a central transfer chamber (TC) 208 surrounded by various low-pressure and high-pressure processing chambers. A first load lock (LL1) 202 is used for introducing a substrate (S) 212 into the transfer chamber (TC) 208. The first load lock (LL1) 202 includes a first door (Door1) 218 for introducing a substrate (S) 212 into the first load lock (LL1) 202 from the surrounding environment, which is typically at atmospheric pressure and room temperature (ambient). The first load lock (LL1) 202 is coupled to the transfer chamber (TC) 208 via a second door (Door2) 220. A first low-pressure processing chamber (LPPC1) 204 is coupled to the transfer chamber (TC) 208 via a third door (Door3) 222. Similarly, a second low-pressure processing chamber (LPPC2) 206 is coupled to the transfer chamber (TC) 208 via a sixth door (Door6) 228. A substrate handling robot 210 is preferably positioned within the transfer chamber (TC) 208 to transfer the substrate (S) 212 through the various doors into the first and second low-pressure processing chambers 204 and 206, respectively. Similar cluster tools having multiple low-pressure processing chambers surrounding a central transfer chamber are well know to those skilled in the art. For example, see U.S. Pat. No. 5,186,718, which is hereby incorporated by reference. Such prior art cluster tools, however, do not contemplate the incorporation of high-pressure processing within the cluster tool.

The system 200 also includes a high-pressure processing module 215. The high-pressure processing module 215 is preferably configured to be coupled to existing cluster tools that incorporate low-pressure processing chambers. The high-pressure processing module 215 includes a second load lock (LL2) 214 configured to be coupled to the transfer chamber (TC) 208 via a fourth door (Door4) 224.

The high-pressure processing module 215 also includes a high-pressure processing chamber (HPPC) 216 coupled to the second load lock (LL2) 214 via a fifth door (Door5) 226. The second load lock (LL2) 214 is similar to the first load lock (LL1) 102 (FIG. 1A), while the high-pressure processing chamber (HPPC) 216 is similar to the high-pressure processing chamber (HPPC) 108 (FIG. 1A), both described above.

The processing chambers, and load locks may be coupled to the transfer chamber (TC) by any suitable means such as corresponding flanges surrounding each co-joining door on both the processing chamber or load lock and the transfer chamber that are bolted to one another and are separated by an suitable o-ring or gasket.

Figure 2B:
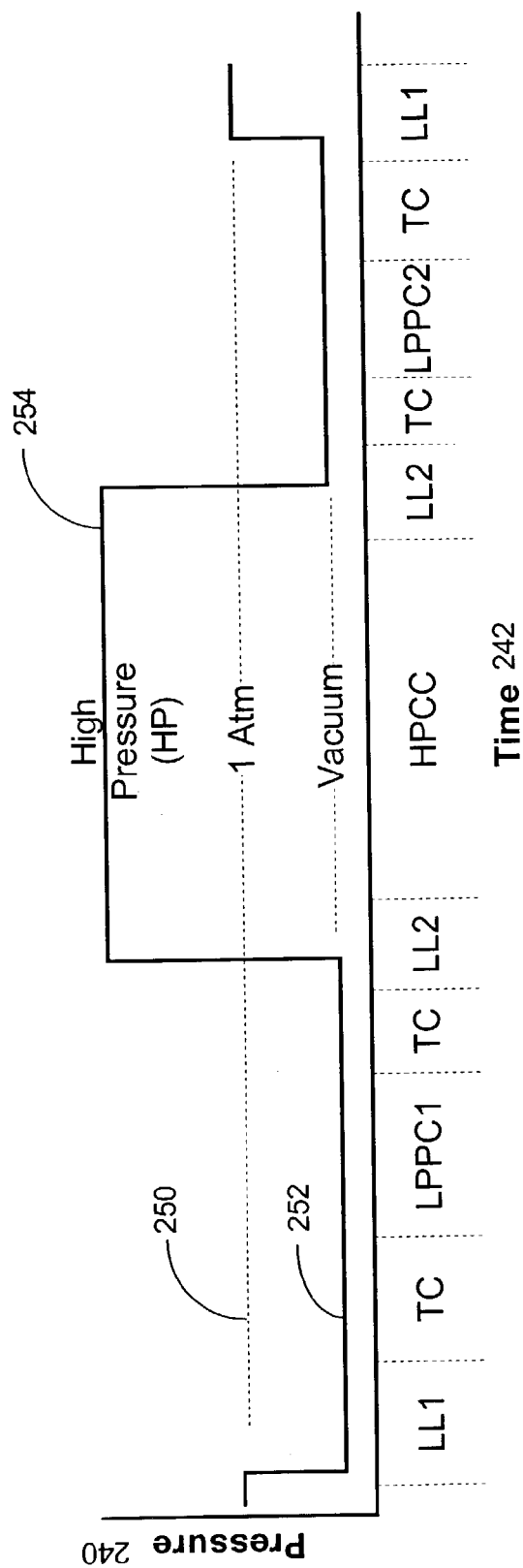
FIG. 2B is a simplified graph of pressure versus time as the substrate passes through the system shown in FIG. 2A.
Figure 2C:
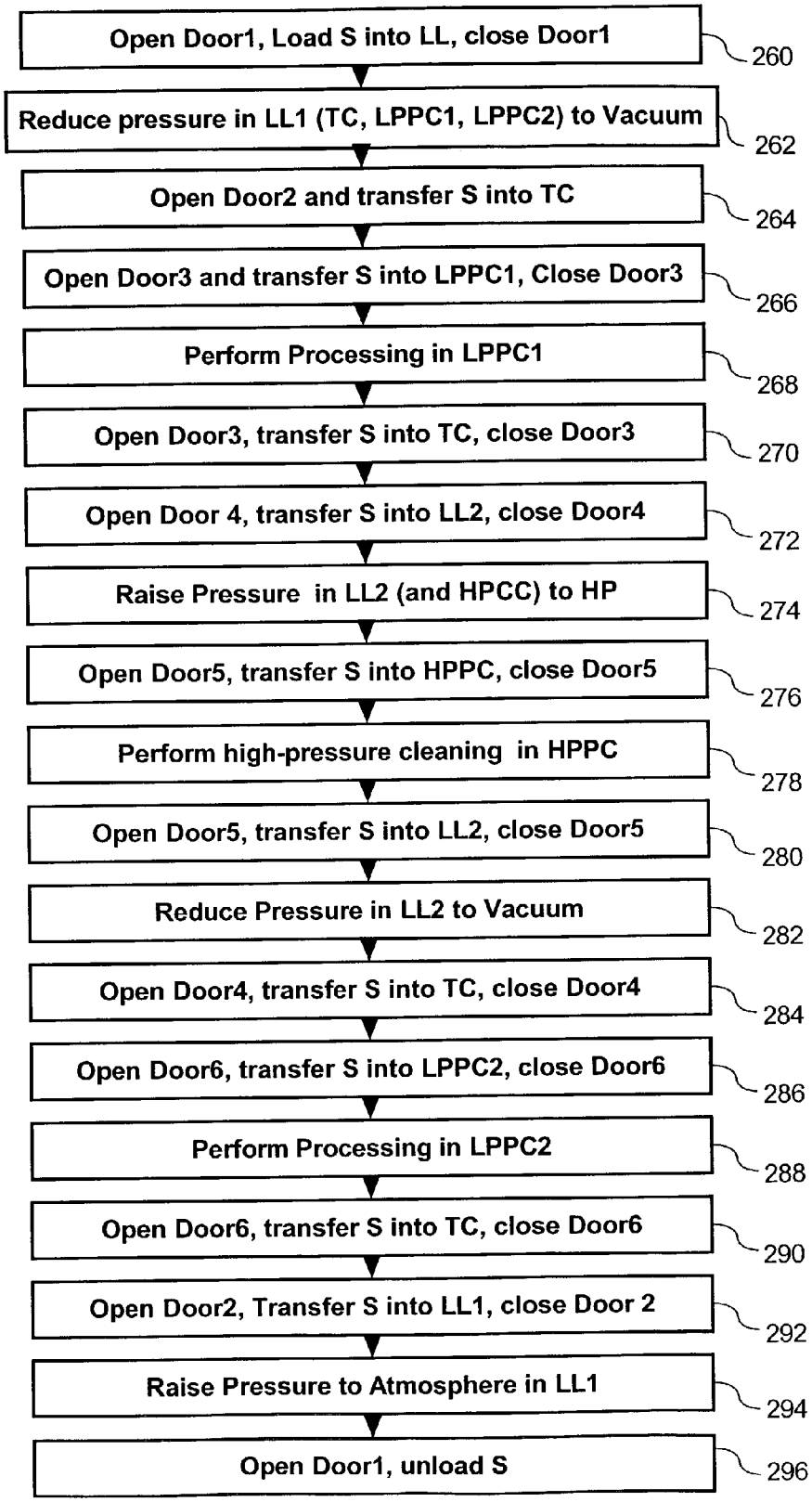
FIG. 2C is a flow chart of the method for processing a substrate, according to the embodiment of the invention described above in relation to FIGS. 2A and 2B.

FIG. 2B is a simplified graph of pressure 240 versus time 242 as the substrate (S) 212 (FIG. 2A) passes through the system shown in FIG. 2A. FIG. 2C is a flow chart of the method for processing a substrate, according to the embodiment of the invention described above in relation to FIGS. 2A and 2B. The following description will primarily refer to FIG. 2C, but will also make reference to FIGS. 2A and 2B. The first door (Door1) 218 is opened; the substrate loaded into the first load lock (LL1) 202; and the first door 218 closed, at step 260. The pressure in the first load lock (LL1) 202 is then lowered from atmospheric pressure 250 (FIG. 2B) to vacuum 252 (FIG. 2B), at step 262. The pressure within the transfer chamber (TC) 208, the first processing chamber (LPPC1) 204, the second load lock (LL2) 214, and the second processing chamber (LPPC2) 206 is either already at or near vacuum, or it is also lowered to vacuum. The second door (Door2) 220 is then opened and the substrate (S) 212 transferred into the transfer chamber (TC) 208, at step 264. The second door may then be closed.

The third door (Door3) 222 is then opened; the substrate transferred into the first low-pressure processing chamber (LPPC1) 204; and the third door (Door3) closed, at step 266. Conventional processing is then performed on the substrate within the first low-pressure processing chamber (LPPC1) 204 at step 268. Once the conventional processing in the first low-pressure processing chamber (LPPC1) 204 is complete, the third door (Door3) 222 is again opened; the substrate transferred out of the first low-pressure processing chamber (LPPC1) 204 into the transfer chamber (TC) 208; and the third door (Door3) closed, as step 270.

The fourth door (Door4) 224 is then opened; the substrate (S) transferred into the second load lock (LL2) 214; and the fourth door (Door4) closed, at step 272. The pressure in the second load lock (LL2) 214 is then raised from vacuum to the high pressure (HP) (256—FIG. 2B), at step 274. The high pressure (HP) is the same as the high pressure described above, i.e., 60 psi to 3000 psi. The pressure in the high-pressure processing chamber (HPPC) 216 is preferably already at or near the high pressure, however, the pressure in this chamber may be raised simultaneously with the pressure in the second load lock, or at any other suitable time. The fifth door (Door5) 226 is then opened; the substrate transferred into the high-pressure processing chamber (HPPC) 216; and the fifth door closed, at step 276.

High-pressure processing then occurs in the high-pressure processing chamber (HPPC) 216 at step 278. The high-pressure processing is the same as that described above, such as supercritical fluid cleaning or the like. The supercritical fluid may contain a single component in a single phase, or may contain one or multiple co-solvents within the primary dense fluid carrier. The co-solvents may be present in a single phase or in a multitude of different phases concurrently, depending on the solubility of the co-solvent components in the dense fluid at the current temperature and pressure.

Once the high-pressure processing has been completed, the fifth door (Door5) 226 is again opened; the substrate transferred into the second load lock (LL2) 214; and the fifth door closed, at step 280. The pressure in the second load lock (LL2) 214 is again reduced to vacuum (254—FIG. 2B), at step 282. Thereafter, the fourth door (Door4) 224 is opened; the substrate transferred into the transfer chamber (TC) 208 from the second load lock; and the fourth door closed, at step 284.

The sixth door (Door6) 228 is then opened; the substrate transferred into the second low-pressure processing chamber (LPPC2); and the sixth door (Door6) 228 closed, at step 286.

Conventional processing is then performed on the substrate within the second low-pressure processing chamber at step 288. Once the conventional processing is completed, the sixth door (Door6) 228 is again opened; the substrate transferred out of the second low-pressure processing chamber and into the transfer chamber; and the sixth door closed, at step 290. It should, however, be appreciated by those skilled in the art that conventional low pressure processing of the substrate may occur either before, after, or both before and after (as described above) the high pressure processing step. Also, it should be appreciated that processing of different substrates may occur simultaneously.

To remove the substrate from the system 200, the second door (Door2) 220 is then opened; the substrate transferred into the first load lock chamber (LL1) 202; and the second door closed, at step 292. The pressure in the first load lock (LL1) 202 is then raised to atmospheric pressure (250—FIG. 2B) at step 294. Finally the first door (Door1) 218 is opened and the substrate unloaded from the first load lock (LL1) 202 at step 296.

Accordingly, a high-pressure processing module 215 may be coupled to an existing cluster tool having one or more conventional processing chambers that operate at or near vacuum. Other advantages include cycle time reduction; and eliminating exposure of sensitive substrates to ambient atmosphere and contamination.

In yet another embodiment, the system 200 does not include the second load lock (LL2) 214. Instead, the pressure within the transfer chamber (TC) 208 itself is raised or lowered between vacuum and the high-pressure. However, as the transfer chamber has a significantly larger internal volume than the second load lock, in order to house the substrate handling robot 210, adjusting the pressure within the transfer chamber is not as efficient as only adjusting the pressure in the second load lock (LL2) 214.

In another embodiment, a supercritical $CO_2$ drying chamber is coupled between a vacuum load lock and a wet process chamber. For example, in the serial layout described in relation to FIG. 1B, the substrate would be transferred from the second load lock (LL2) into a wet chamber; then into the high-pressure processing chamber (HPCC); then into the third load lock (LL3); etc. Similarly, in the cluster layout described in relation to FIG. 2A, the simplest modification is to add a wet chamber 217 above the high-pressure processing chamber (HPCC) 216. However, the HPCC would now act only as a pass through chamber going into the wet chamber 217, and must remain idle and empty to serve this purpose. A more preferred embodiment is a configuration that has a one-way loop off the side of the central transfer chamber (TC) 208. The processing sequence would be from the TC 208; into an optional load lock to prevent moisture from moving from the wet chamber 217 into the TC; into the wet chamber 217; into the HPCC for $CO_2$ drying; back into the optional load lock; and back into the TC 208.

The foregoing descriptions of specific embodiments of the present invention are presented for purposes of illustration and description. For example, any methods described herein are merely examples intended to illustrate one way of performing the invention. They are not intended to be exhaustive or to limit the invention to the precise forms disclosed. Obviously many modifications and variations are possible in view of the above teachings. For example, the use of the term vacuum refers to at or near vacuum. The use of the term supercritical refers to liquified gases or dense fluids as well as to supercritical fluids. In addition, other suitable processing steps may be included that could occur at atmospheric pressures, at high pressures, and/or at vacuum, as is known to those skilled in the art. Also, any graphs described herein are not drawn to scale. The embodiments were chosen and described in order to best explain the principles of the invention and its practical applications, to thereby enable others skilled in the art to best utilize the invention and various embodiments with various modifications as are suited to the particular use contemplated. Furthermore, the order of steps in the method are not necessarily intended to occur in the sequence laid out. It is intended that the scope of the invention be defined by the following claims and their equivalents.

What we claim is:

1. A method for processing a semiconductor substrate with a dense phase fluid, comprising;
    transferring a semiconductor substrate from an environment at about vacuum into a load lock through a first door;
    sealing said substrate within said load lock;
    raising pressure within said load lock to a pressure of from about 60 to about 3000 psi above vacuum;
    opening a second door coupling said load lock to a first processing chamber;
    moving said substrate from said load lock into said first processing chamber;
    sealing said substrate within said first processing chamber; and
    processing said substrate by contacting said substrate with a dense phase fluid within said first processing chamber.

2. The method for processing a semiconductor substrate of claim 1, wherein said processing is cleaning.

3. The method for processing a semiconductor substrate of claim 1, wherein said substrate had been subject to a deposition process prior to said processing.

4. The method for processing a semiconductor substrate of claim 1, further comprising;
    opening said second door;
    transferring said substrate into said load lock at the pressure of said first processing chamber;
    sealing said substrate within said load lock;
    lowering the pressure within said load lock to about vacuum;
    opening said first door; and
    removing said substrate from said load lock.

5. The method for processing a semiconductor substrate of claim 1, further comprising before said transferring;
    loading said substrate from an environment at about atmospheric pressure into an additional load lock through a third door;
    sealing said additional load lock;
    reducing pressure in said additional load lock to about vacuum.

6. The method for processing a semiconductor substrate of claim 1, wherein said dense phase fluid is $CO_2$, where said contacting is at a temperature of about 35 degrees C.

7. The method for processing a semiconductor substrate of claim 1, wherein said first processing chamber is at a pressure of between about 1070 psi to about 1800 psi at a temperature of about 35 degrees C.

8. The method for processing a semiconductor substrate of claim 1, wherein said processing comprises cleaning said substrate with liquid $CO_2$, where said pressure within said first processing chamber is between about 100 psi to about 500 psi at a temperature of about 35 degrees C.

9. The method for processing a semiconductor substrate of claim 4, further comprising:
    removing said substrate from said load lock into a second processing chamber at vacuum;
    sealing said substrate within said second processing chamber; and
    processing said substrate within said second processing chamber.

10. The method for processing a semiconductor substrate of claim 5, further comprising after said reducing:
    transferring said substrate from said additional load lock into a second processing chamber at vacuum;
    sealing said substrate within said second processing chamber; and
    processing said substrate within said second processing chamber.

11. The method for processing a semiconductor substrate of claim 5, further comprising after said reducing:
    transferring said substrate from said additional load lock into a transfer chamber at vacuum;
    transferring said substrate from said transfer chamber into a second processing chamber;
    sealing said substrate within said second processing chamber; and
    processing said substrate within said second processing chamber.

12. The method for processing a semiconductor substrate of claim 7, wherein said dense phase fluid is selected from a group consisting of: methane, ethane, propane, butane, pentane, hexane, ethylene, propylene, tetrafluoromethane, chlorodifluoromethane, sulfur hexafluoride, perfluoropropane, carbon dioxide, ammonia, helium, krypton, argon, sulfur trioxide, nitrous oxide, and mixtures of the aforementioned.

13. The method for processing a semiconductor substrate of claim 9, further comprising removing said substrate from said second processing chamber.

14. The method for processing a semiconductor substrate of either claim 4 or 13, further comprising:
    transferring said substrate into an additional load lock;
    sealing said additional load lock;
    raising the pressure in said additional load lock from vacuum to atmospheric pressure; and
    unloading said substrate from said additional load lock into an ambient environment.

* * * * *